(12) United States Patent
Iwata et al.

(10) Patent No.: US 7,136,441 B2
(45) Date of Patent: Nov. 14, 2006

(54) CLOCK RECOVERY CIRCUIT

(75) Inventors: Toru Iwata, Osaka (JP); Hiroyuki Yamauchi, Osaka (JP); Takefumi Yoshikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 689 days.

(21) Appl. No.: 10/038,613

(22) Filed: Jan. 8, 2002

(65) Prior Publication Data

US 2002/0097826 A1 Jul. 25, 2002

(30) Foreign Application Priority Data

Jan. 24, 2001 (JP) ............... 2001-015342

(51) Int. Cl.
*H04L 7/00* (2006.01)
(52) U.S. Cl. .............. 375/355; 375/356; 375/357; 375/358
(58) Field of Classification Search ........... 375/355, 375/376, 371, 362, 375, 360; 327/146, 162; 329/307, 325
See application file for complete search history.

(56) References Cited

U.S. PATENT DOCUMENTS

| | | | |
|---|---|---|---|
| 5,493,571 A * | 2/1996 | Engdahl et al. | 370/514 |
| 5,570,370 A * | 10/1996 | Lin | 370/347 |
| 5,670,913 A * | 9/1997 | Garcia Palancar | 331/4 |
| 5,889,828 A * | 3/1999 | Miyashita et al. | 375/374 |
| 6,040,742 A * | 3/2000 | Bailey et al. | 331/2 |
| 6,064,248 A * | 5/2000 | Seki | 327/296 |
| 6,229,362 B1 * | 5/2001 | Choi | 327/157 |
| 6,236,696 B1 * | 5/2001 | Aoki et al. | 375/376 |
| 6,466,634 B1 * | 10/2002 | O'Toole et al. | 375/374 |
| 6,643,787 B1 * | 11/2003 | Zerbe et al. | 713/400 |
| 6,763,060 B1 * | 7/2004 | Knapp | 375/219 |

FOREIGN PATENT DOCUMENTS

| | | |
|---|---|---|
| JP | 5-126357 | 10/1981 |
| JP | 61-70830 | 4/1986 |
| JP | 5-136635 | 6/1993 |
| JP | 8-237117 | 9/1996 |
| JP | 10-327068 | 12/1998 |
| JP | 11-122232 | 4/1999 |
| JP | 11-215112 | 8/1999 |
| JP | 11-243327 | 9/1999 |

OTHER PUBLICATIONS

D.H. Wolaver, "Phase-Locked Loop Circuit Design", Section 10-2, pp. 213-216, Prentice Hall (1991).
R. Gu, et al., "A 0.5-3.5Gb/s Low-Power Low-Jitter Serial Data CMOS Transceiver", ISSCC Digest of Technical Papers, pp. 352-353, Feb. 1999.

* cited by examiner

*Primary Examiner*—Jean B Corrielus
*Assistant Examiner*—Qutub Ghulamali
(74) *Attorney, Agent, or Firm*—McDermott Will & Emery LLP

(57) ABSTRACT

A driver and a receiver supply a data signal, which is based on serial data having a regular bit pattern, such as a clock, which includes 1's and 0's alternating with each other during an adjustment period, and is based on serial data having an arbitrary bit pattern during a transfer period following the adjustment period. A duty factor controller adjusts a data transition characteristic of the driver or the receiver so that a duty factor of the data signal supplied from the receiver is equal to 50% in the adjustment period, and has the adjusted data transition characteristic stored. A clock recovery unit recovers a clock synchronized with a data signal, which is supplied from the receiver in the transfer period and is based on the adjusted transition characteristic, from the data signal.

5 Claims, 7 Drawing Sheets

CLOCK RECOVERY CIRCUIT

BACKGROUND OF THE INVENTION

The present invention relates to a clock recovery circuit or a clock recovery unit suitable for high-speed differential interface.

IEEE 1394.b standard defines small-amplitude differential serial data transfer. A clock recovery technique for recovering, from a data signal, a clock that is synchronized with the data signal is required for a receiving unit used in such serial data transfer.

An example of a conventional clock recovery technique is shown in D. H. Wolaver, "Phase-Locked Loop circuit Design", Section 10–2, pp. 213–216, Prentice Hall (1991). In this example, the format of a data signal is converted from NRZ (non-return-to-zero) to RZ (return-to-zero), and then a clock is recovered from the RZ data signal with a PLL (phase-locked loop).

Basically, an H level duration and an L level duration of an NRZ data signal are both an integer multiple of one data interval. However, the H level duration, for example, may become shorter than one data interval due to a skew occurring in a differential amplifier or a differential transfer path, or due to process variations. In such a case, with the conventional example, a timing jitter occurs in the recovered clock.

Moreover, with the conventional example, a phase detector and a charge pump of the PLL need to update the respective outputs for each data interval, whereby the operating speed of these elements limits the data rate.

SUMMARY OF THE INVENTION

A first object of the present invention is to suppress a timing jitter of a clock recovery circuit.

A second object of the present invention is to provide a clock recovery unit suitable for high-speed data transfer.

In order to realize the first object, the present invention provides a period in which a data transition characteristic of a driver or a receiver is adjusted so that a duty factor (DF) of a data signal is equal to 50% using a regular bit pattern, such as a clock, for example, which includes 1's and 0's alternating with each other, so that the clock can be recovered from the data signal, which is based on the adjusted transition characteristic, during an actual data transfer period.

Specifically, a clock recovery circuit of the present invention includes: transceiver means for supplying a data signal, which is based on serial data having a regular bit pattern during a first period, and is based on serial data having an arbitrary bit pattern during a second period following the first period; a duty factor controller for adjusting a data transition characteristic of the transceiver means so as to reduce a duty factor error in a data signal supplied from the transceiver means in the first period, and having the adjusted data transition characteristic stored; and a clock recovery unit for recovering, from the data signal supplied from the transceiver means, a clock synchronized with the data signal in the second period.

In order to realize the second object, the present invention provides a section for performing a phase detection and a charge pump operation in response to the rising edge of a data signal and another section for performing a phase detection and a charge pump operation in response to the falling edge of the data signal, and operates these sections in an interleaved manner.

Specifically, a clock recovery unit of the present invention includes: a voltage controlled oscillator for generating a clock having a frequency according to a control voltage; a first charge pump and a second charge pump whose respective outputs are coupled to a common node; a first phase detector for detecting a phase error in the clock with respect to one of a rising edge and a falling edge of the data signal so as to control the first charge pump according to the phase error; and a second phase detector for detecting a phase error in the clock with respect to the other edge of the data signal so as to control the second charge pump according to the phase error, wherein a voltage that is generated at the common node by the first and second charge pumps is given to the voltage controlled oscillator as the control voltage so that the phase error detected by the first phase detector and the phase error detected by the second phase detector are both reduced.

DETAILED DESCRIPTION OF THE INVENTION

Various embodiments of the present invention suitable for serial data transfer compliant with IEEE 1394.b standard will now be described with reference to the accompanying drawings.

FIRST EMBODIMENT

Figure 1:
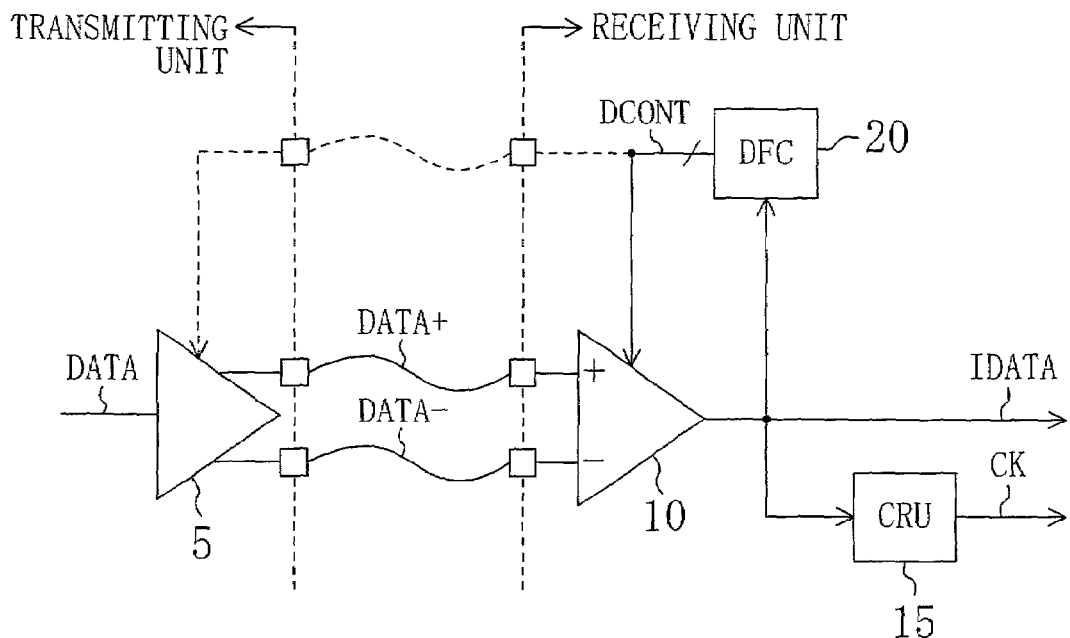
FIG. 1 is a block diagram illustrating a configuration of a clock recovery circuit according to a first embodiment of the present invention.

FIG. 1 illustrates a configuration of a clock recovery circuit according to a first embodiment of the present invention. In FIG. 1, a transmitting unit includes a driver 5, and a receiving unit includes a receiver 10, a clock recovery unit (CRU) 15 and a duty factor controller (DFC) 20. The driver 5 supplies differential data (DATA+/DATA−), which is based on given serial data (DATA), to a pair of signal lines. The receiver 10 receives the differential data signal from the pair of signal lines, and supplies a single end data signal corresponding to the differential data signal as an input data (IDATA) signal. The driver 5 and the receiver 10 together form transceiver means for supplying an IDATA signal, which is based on serial data having a regular bit pattern, such as a clock, for example, which includes 1's and 0's alternating with each other during the adjustment period, and is based on serial data having an arbitrary bit pattern during the transfer period following the adjustment period. The DFC 20 is a controller for adjusting the data transition characteristic of the driver 5 or the receiver 10 so as to reduce the DF error in an IDATA signal, e.g., so that the DF of the IDATA signal is equal to 50%, in the adjustment period, and having the adjusted data transition characteristic stored. The designation "DCONT" denotes a DF control signal according to the detected DF error in the IDATA signal. The CRU 15 is a unit for recovering a clock CK synchronized with the IDATA signal in the transfer period.

Figure 2:
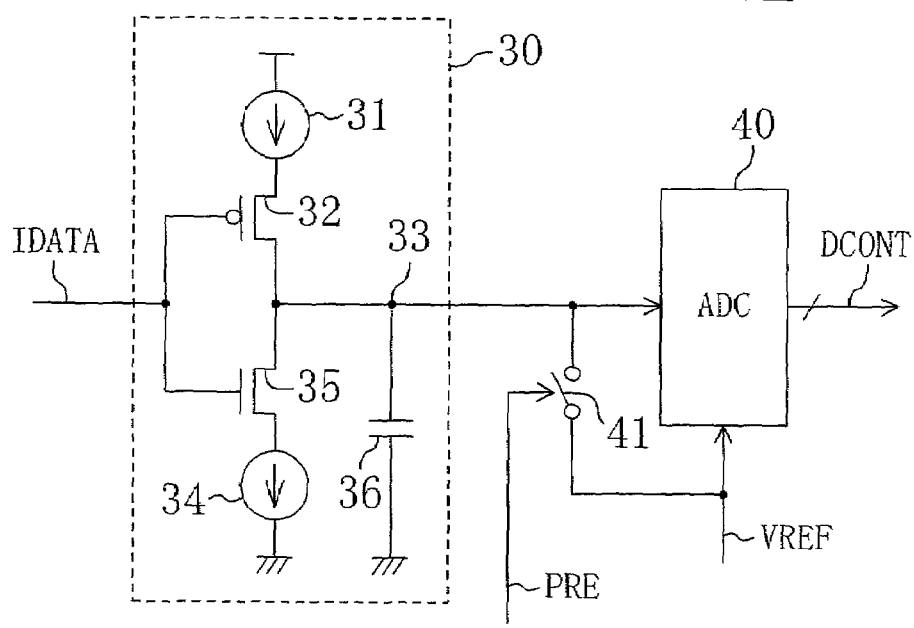
FIG. 2 is a circuit diagram illustrating a specific configuration of a duty factor controller (DFC) in FIG. 1.

FIG. 2 illustrates a specific configuration of the DFC 20 in FIG. 1. The DFC 20 of FIG. 2 includes an integrator circuit 30, an analog-to-digital converter (ADC) 40 and a switch 41. The integrator circuit 30 is a circuit for integrating an IDATA signal so as to output an analog voltage representing the DF error in the IDATA signal. The integrator circuit 30 includes a first current source 31, a second current source 34, a PMOS switch 32, an NMOS switch 35 and a capacitor 36. The respective gates of the PMOS switch 32 and the NMOS switch 35 receive an IDATA signal. One end of the capacitor 36 is connected to an integration node 33. The integration node 33 is connected to a power supply voltage via the first current source 31 and the PMOS switch 32, and to a ground voltage via the second current source 34 and the NMOS switch 35. The ADC 40 receives a reference voltage VREF, and outputs, as a DCONT signal, a digital signal according to the analog output voltage from the integrator circuit 30, i.e., the voltage at the integration node 33. The switch 41 is closed in response to a precharge (PRE) signal, thereby initializing the voltage at the integration node 33 to the reference voltage VREF.

With the configuration of FIG. 2, if the H level duration and the L level duration of an IDATA signal are both equal to one data interval in the adjustment period, the amount of charge that flows into the integration node 33 via the PMOS switch 32 is equal to the amount of charge that flows out of the integration node 33 via the NMOS switch 35, whereby the voltage at the integration node 33 is constant. Otherwise, the ADC 40 monitors the voltage at the integration node 33 and feeds back a DCONT signal according to the monitoring results to the driver 5 or the receiver 10 so as to achieve the ideal state, whereby the DF of the IDATA signal can be controlled to be equal to 50%. In this way, the data transition characteristic of the driver 5 or the receiver 10 is adjusted before entering the actual data transfer period, thereby suppressing a timing jitter in the recovered clock CK.

The circuit operation of the DFC 20 can be stabilized by separately providing a period in which the integrator circuit 30 operates, a period in which the ADC 40 operates, a period in which information is fed back to the driver 5 or the receiver 10, and a period in which the integration node 33 is precharged.

Figure 3:
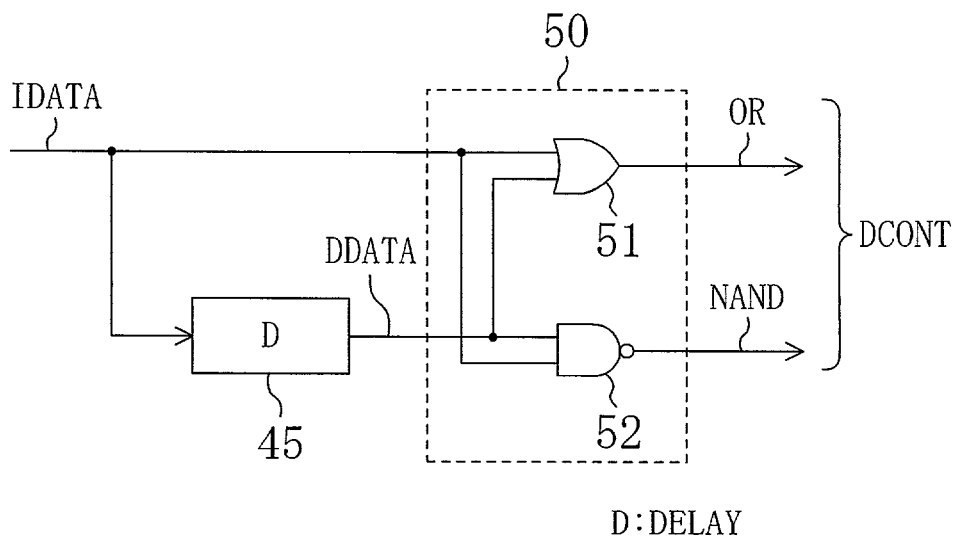
FIG. 3 is a circuit diagram illustrating another specific configuration of the duty factor controller (DFC) in FIG. 1.

FIG. 3 is another specific configuration of the DFC 20 in FIG. 1. The DFC 20 of FIG. 3 includes a delay circuit 45 and a logic circuit 50. The delay circuit 45 is a circuit for generating delayed data (DDATA) signal that is delayed by one data interval with respect to the IDATA signal. For example, the delay circuit 45 is formed by a replica of a delay line used for a voltage controlled oscillator (VCO) in the CRU 15. The logic circuit 50 is a circuit for outputting, as a DCONT signal, a signal according to a plurality of logical operation results of the IDATA signal and the DDATA signal. For example, the logic circuit 50 is formed by an OR gate 51 for generating an OR signal and a NAND gate 52 for generating a NAND signal.

Figure 4:
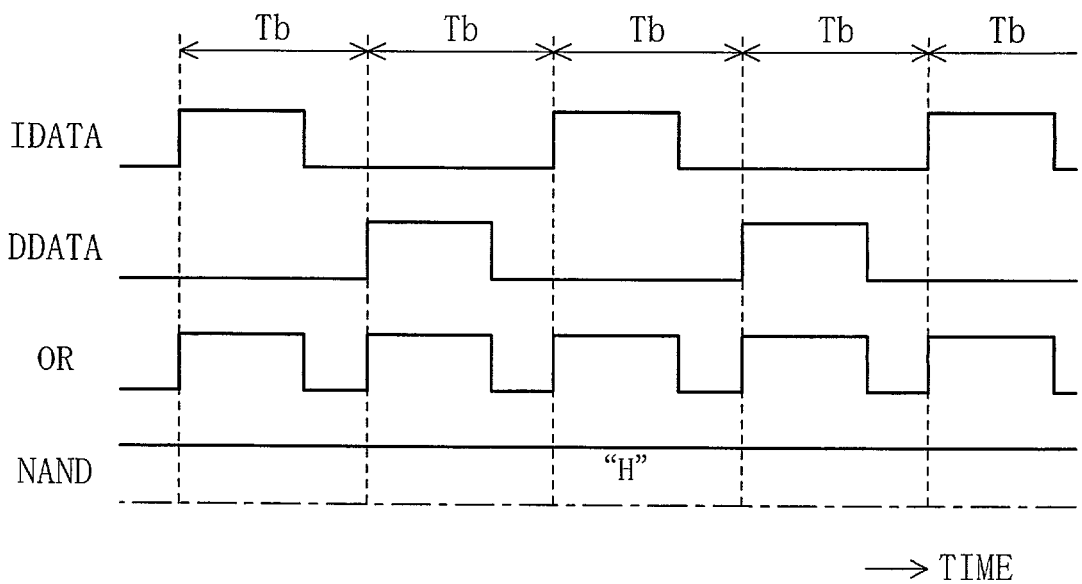
FIG. 4 is a timing chart diagram illustrating an operation of the DFC of FIG. 3 in a case where a DF of a data signal in an adjustment period is less than 50%.

FIG. 4 illustrates an operation of the DFC 20 of FIG. 3 in a case where the DF of the IDATA signal in the adjustment period is less than 50%. According to FIG. 4, the H level duration of the IDATA signal is shorter than one data interval Tb. The DDATA signal is a signal obtained by delaying the IDATA signal by one data interval Tb. Therefore, there is a period in which the IDATA signal and the DDATA signal both indicate an L level, and the OR signal is at the L level during such a period. The OR signal requests the driver 5 or the receiver 10 to extend the H level duration of the IDATA signal.

Figure 5:
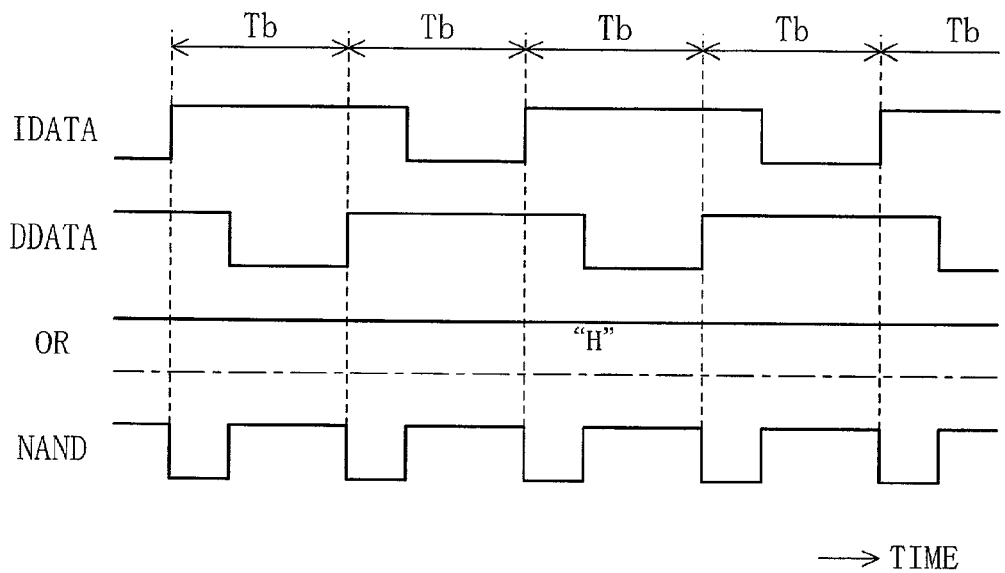
FIG. 5 is a timing chart diagram illustrating an operation of the DFC of FIG. 3 in a case where a DF of a data signal in an adjustment period is greater than 50%.

FIG. 5 illustrates an operation of the DFC 20 of FIG. 3 in a case where the DF of the IDATA signal in the adjustment period is greater than 50%. According to FIG. 5, the H level duration of the IDATA signal is longer than one data interval Tb. The DDATA signal is a signal obtained by delaying the IDATA signal by one data interval Tb. Therefore, there is a period in which the IDATA signal and the DDATA signal both indicate an H level, and the NAND signal is at the L level during such a period. The NAND signal requests the driver 5 or the receiver 10 to shorten the H level duration of the IDATA signal.

With the configuration illustrated in FIG. 1 and FIG. 3, the data transition characteristic of the driver 5 or the receiver 10 is adjusted so that the DF of the IDATA signal in the adjustment period is equal to 50% as described above, before entering the actual data transfer period, thereby suppressing a timing jitter in the recovered clock CK.

SECOND EMBODIMENT

Figure 6:
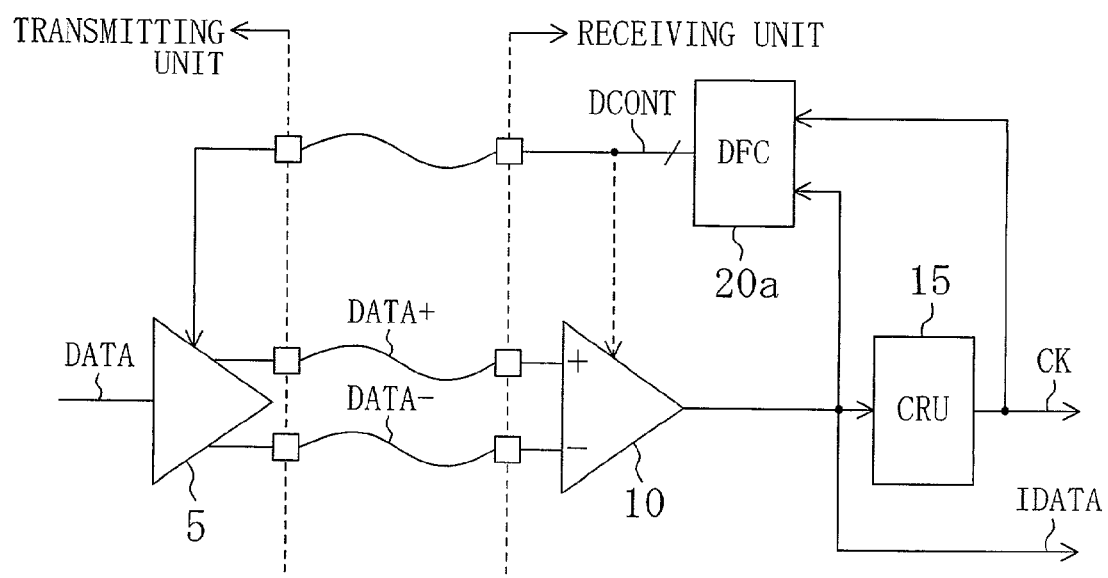
FIG. 6 is a block diagram illustrating a configuration of a clock recovery circuit according to a second embodiment of the present invention.

FIG. 6 illustrates a configuration of a clock recovery circuit according to a second embodiment of the present invention. In FIG. 6, a transmitting unit includes the driver 5, and a receiving unit includes the receiver 10, the CRU 15 and a DFC 20a. The configuration differs from that of FIG. 1 in that the DFC 20a detects a phase error in the recovered clock CK with respect to the IDATA signal in the adjustment period so as to give a DCONT signal according to the magnitude of the phase error to the driver 5 or the receiver 10.

With the configuration of FIG. 6, the data transition characteristic of the driver 5 or the receiver 10 is adjusted so as to reduce the phase error in the recovered clock CK with respect to the IDATA signal in the adjustment period, thereby achieving a DF adjustment of the IDATA signal. In this way, the data transition characteristic of the driver 5 or the receiver 10 is adjusted before entering the actual data transfer period, thereby suppressing a timing jitter in the recovered clock CK. An example of the DFC 20a will be described later.

THIRD EMBODIMENT

Figure 7:
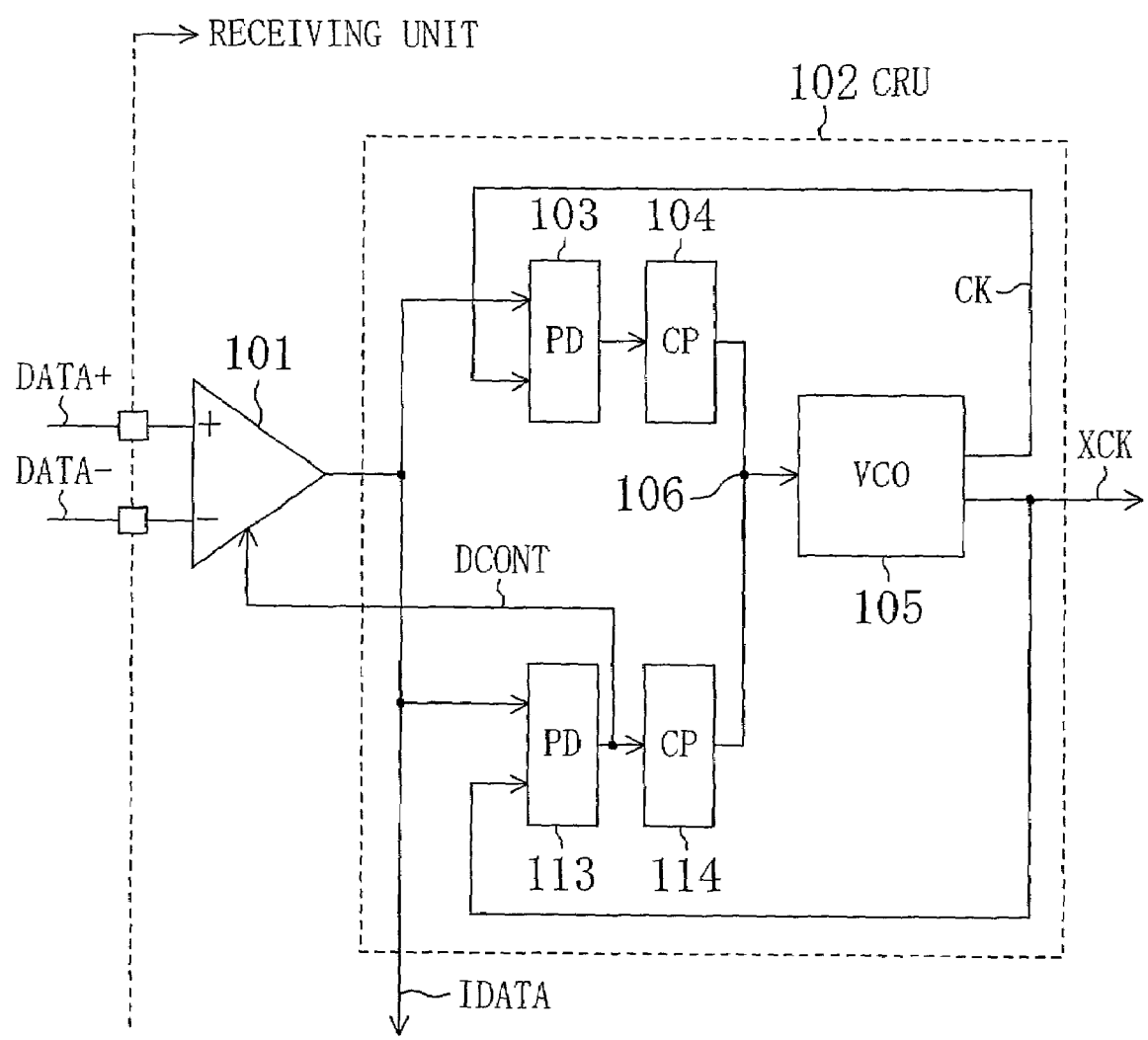
FIG. 7 is a block diagram illustrating a configuration of a clock recovery circuit according to a third embodiment of the present invention.

FIG. 7 illustrates a configuration of a clock recovery circuit according to a third embodiment of the present invention. A receiving unit illustrated in FIG. 7 includes a receiver 101 and a CRU 102. The receiver 101 receives a differential data (DATA+/DATA−) signal from a pair of signal lines, and supplies a single end IDATA signal corresponding to the differential data signal. The CRU 102 is a unit for recovering a clock CK synchronized with the IDATA signal, and includes a first phase detector (PD) 103, a first charge pump (CP) 104, a voltage controlled oscillator (VCO) 105, a second phase detector (PD) 113, and a second charge pump (CP) 114. Reference numeral 106 denotes a common node coupled to the respective outputs of the first and second CPs 104 and 114 and to the input of the VCO 105. The VCO 105 receives, as a control voltage, a voltage that is generated at the common node 106 by the first and second CPs 104 and 114, and generates a clock having a frequency according to the control voltage. The clock is a two-phase clock made of a non-inverted clock (CK) signal and an inverted clock (XCK) signal. The first PD 103 detects a phase error in the rising edge of the CK signal with respect to the rising edge of the IDATA signal, and controls the first CP 104 according to the phase error. The first PD 103, the first CP 104 and the VCO 105 together form a first PLL path. The second PD 113 detects a phase error in the falling edge of the XCK signal with respect to the falling edge of the IDATA signal, and controls the second CP 114 according to the phase error. The second PD 113, the second CP 114 and the VCO 105 together form a second PLL path. The first and second PLL paths operate so that the phase error detected by the first PD 103 and the phase error detected by the second PD 113 are both reduced. Moreover, the output of the second PD 113 is given to the receiver 101 as a DCONT signal, and the data transition characteristic of the receiver 101 is adjusted according to the DCONT signal as described above with reference to FIG. 6.

Figure 8:
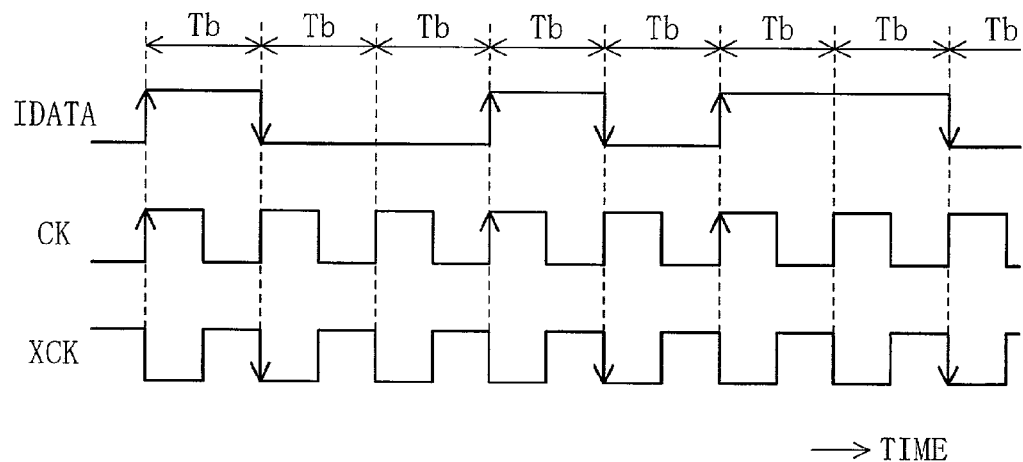
FIG. 8 is a timing chart diagram illustrating a PLL operation of a clock recovery unit (CRU) in FIG. 7.

FIG. 8 illustrates an example of a PLL operation of the CRU 102 in FIG. 7. According to FIG. 8, an IDATA signal having a bit pattern '10010110' is supplied to the CRU 102 at the data interval Tb. The IDATA signal is a data signal of an NRZ format. The first PLL path controls the phase error in the rising edge of the CK signal with respect to the rising edge of the IDATA signal to zero. At this time, the first PD 103 and the first CP 104 are only required to update the respective outputs in two data intervals (2 Tb's). On the other hand, the second PLL path controls the phase error in the falling edge of the XCK signal with respect to the falling edge of the IDATA signal to zero. Again, the second PD 113 and the second CP 114 are only required to update the respective outputs in two data intervals (2 Tb's). Thus, the data rate can be doubled from that in the prior art by employing an interleaved operation of the two PLL paths.

Figure 9:
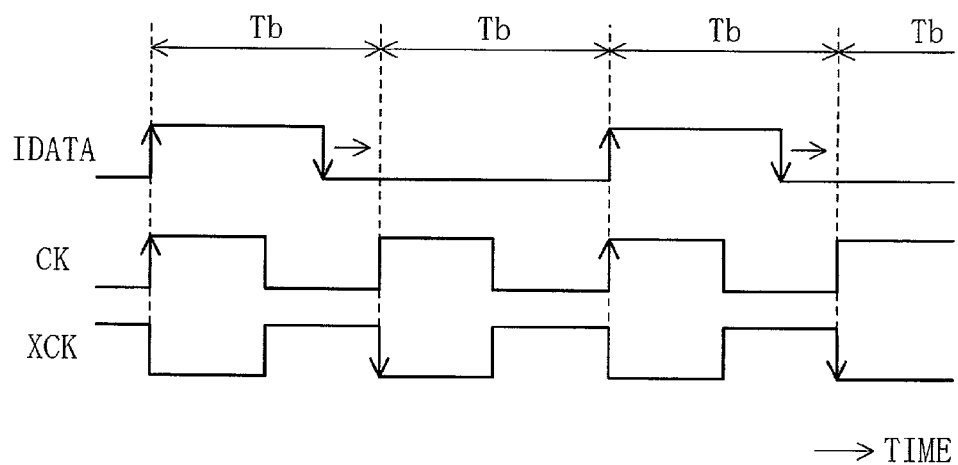
FIG. 9 is a timing chart diagram illustrating a DF adjustment operation of the CRU in FIG. 7.

FIG. 9 illustrates an example of a DF adjustment operation of the CRU 102 in FIG. 7. It is assumed that for a stable operation of the circuit, the phase of the rising edge of the CK signal is first adjusted by the first PLL path, and then the DF of the IDATA signal is adjusted by the second PD 113 and the receiver 101, after which the phase of the falling edge of the XCK signal is adjusted by the second PLL path. In the example of the DF adjustment operation illustrated in FIG. 9, the H level duration of the IDATA signal is shorter than one data interval Tb. Therefore, the second PD 113 detects a lag phase error in the falling edge of the XCK signal with respect to the falling edge of the IDATA signal, and gives the receiver 101 a DCONT signal according to the magnitude of the lag phase error. In response to this, the receiver 101 changes the data transition characteristic so as to extend the H level duration of the IDATA signal. As a result, the phase of the falling edge of the IDATA signal is adjusted so that the H level duration of the IDATA signal is equal to one data interval Tb. Thus, the rising edge of the XCK signal is positioned at the center of an IDATA pulse, which is advantageous for a data latch operation to be performed by a circuit in the next stage following the CRU 102.

As described above, with the configuration of FIG. 7, the data rate can be doubled from that in the prior art, while suppressing a timing jitter in the recovered clock. Alternatively, the output of the first PD 103 may be used as a DCONT signal to be given to the receiver 101, instead of the output of the second PD 113.

FOURTH EMBODIMENT

Figure 10:
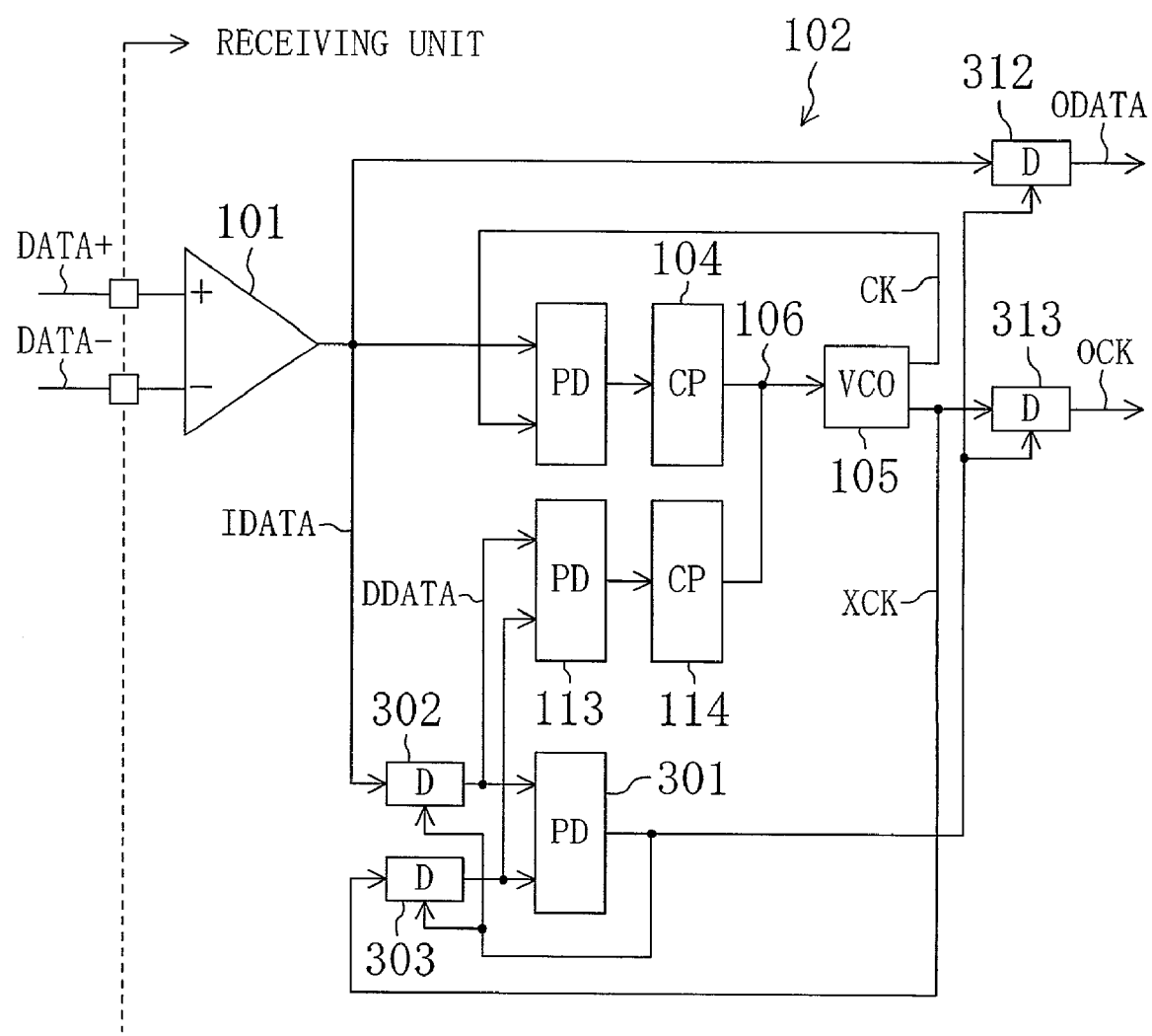
FIG. 10 is a block diagram illustrating a configuration of a clock recovery circuit according to a fourth embodiment of the present invention.

FIG. 10 illustrates a configuration of a clock recovery circuit according to a fourth embodiment of the present invention. The CRU 102 of FIG. 10 includes, in addition to the elements shown in FIG. 7, a third phase detector (PD) 301, a first delay circuit (D) 302, a second delay circuit (D) 303, a third delay circuit (D) 312, and a fourth delay circuit (D) 313. The delay circuits 302, 303, 312 and 313 each have a variable delay amount. The initial value of each delay amount is set to zero, for example. The designation "ODATA" denotes an output data signal, and "OCK" denotes an output clock signal.

The first delay circuit 302 is inserted in a data input path of the second PD 113 (an input path for the IDATA signal), and the second delay circuit 303 is inserted in a clock input path of the second PD 113 (an input path for the XCK signal). The third PD 301 detects a phase error in the output of the second delay circuit 303 with respect to the output of the first delay circuit 302, and adjusts either one of the delay amount of the first delay circuit 302 and the delay amount of the second delay circuit 303 so as to reduce the phase error. As a specific example, in a case where the third PD 301 detects that the falling edge of the output signal of the second delay circuit 303 has a lag phase error with respect to the falling edge of the DDATA signal appearing in the output of the first delay circuit 302, the third PD 301 increases the delay amount of first delay circuit 302 so as to reduce the lag phase error, and has the increased delay amount stored. Conversely, in a case where the third PD 301 detects that the falling edge of the output signal of the second delay circuit 303 has a lead phase error with respect to the falling edge of the DDATA signal, the third PD 301 increases the delay amount of the second delay circuit 303 so as to reduce the lead phase error, and has the increased delay amount stored. For such an adjustment of the delay amount of the first delay circuit 302 or the delay amount of the second delay circuit 303, there is provided a period, prior to the actual data transfer period, in which the first delay circuit 302 receives an adjustment signal based on serial data having a regular bit pattern including 1's and 0's alternating with each other. Thus, with the configuration of FIG. 10, a delay adjustment is performed, instead of performing a DF adjustment as with the configuration of FIG. 7. Therefore, with the configuration of FIG. 10, the DF of the IDATA signal does not have to be equal to 50%.

The third delay circuit 312 is inserted between the IDATA signal and the ODATA signal, and the fourth delay circuit 313 is inserted between the XCK signal and the OCK signal. The third delay circuit 312 is controlled by the third PD 301, and outputs, as the ODATA signal, a signal obtained by delaying the IDATA signal by one half of the delay amount of the first delay circuit 302. The fourth delay circuit 313 is controlled by the third PD 301, and outputs, as the OCK signal, a signal obtained by delaying the XCK signal by one half of the delay amount of the second delay circuit 303.

Figure 11:
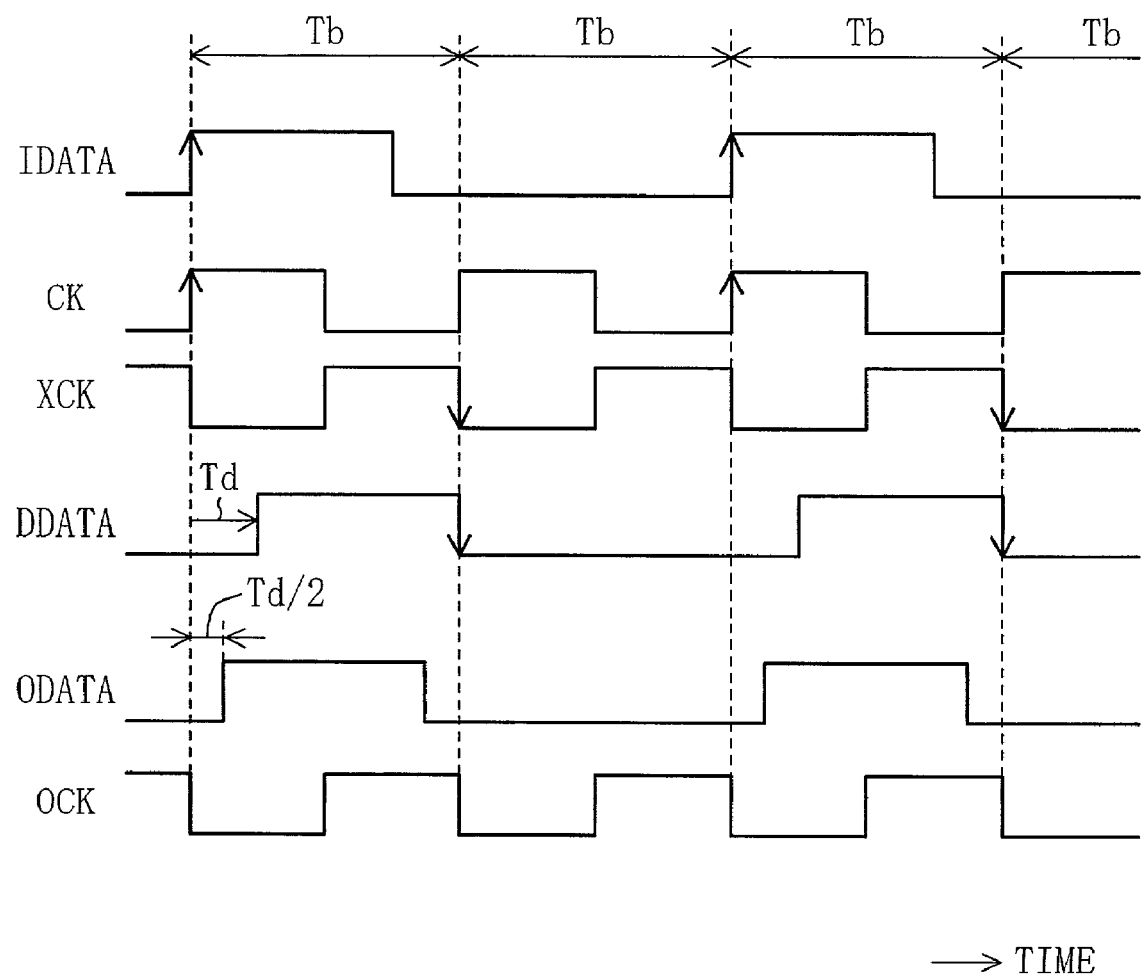
FIG. 11 is a timing chart diagram illustrating an operation of a CRU in FIG. 10.

FIG. 11 illustrates an example of an operation of the CRU 102 in FIG. 10. It is assumed that for a stable operation of the circuit, the phase of the rising edge of the CK signal is first adjusted by the first PLL path, and then a delay adjustment is performed by the third PD 301, the first delay circuit 302 and the second delay circuit 303, after which the phase of the falling edge of the XCK signal is adjusted by the second PLL path. In the example of the delay adjustment operation illustrated in FIG. 11, the H level duration of the IDATA signal is shorter than one data interval Tb. Therefore, the third PD 301 detects a lag phase error in the falling edge of the XCK signal with respect to the falling edge of the IDATA signal, and a delay amount Td according to the lag phase error is given by the first delay circuit 302 between the IDATA signal and the DDATA signal. As a result, the phase error in the falling edge of the XCK signal with respect to the falling edge of the DDATA signal is zero as illustrated in FIG. 11. In response to this, the third delay circuit 312 gives a delay amount Td/2 between the IDATA signal and the ODATA signal. Thus, the rising edge of the OCK signal is positioned at the center of an ODATA pulse, which is advantageous for a data latch operation to be performed by a circuit in the next stage following the CRU 102.

As described above, with the configuration of FIG. 10, the data rate can be doubled from that in the prior art, while suppressing a timing jitter in the recovered clock. Alternatively, the first and second delay circuits 302 and 303 for delay adjustment may be inserted in the first PLL path, instead of in the second PLL path.

While the receiver 10 in FIG. 1 and FIG. 6 has a single end output, the present invention may alternatively be applied to a clock recovery circuit having a receiver of a differential output type. This similarly applies to the receiver 101 in FIG. 7 and FIG. 10.

What is claimed is:

1. A clock recovery unit for recovering a clock synchronized with a given data signal, the clock recovery unit comprising:
   a voltage controlled oscillator for generating a clock having a frequency according to a control voltage;
   a first charge pump and a second charge pump whose respective outputs are coupled to a common node;
   a first phase detector for detecting a phase error in the clock with respect to one of a rising edge and a falling edge of the data signal so as to control the first charge pump according to the phase error;
   a second phase detector for detecting a phase error in the clock with respect to the other one of the rising edge and the falling edge of the data signal so as to control the second charge pump according to the phase error detected by the second phase detector; and
   means for controlling a transition characteristic of the data signal according to an output of one of the first and second phase detectors,
   wherein a voltage that is generated at the common node by the first and second charge pumps is given to the voltage controlled oscillator as the control voltage so that the phase error detected by the first phase detector and the phase error detected by the second phase detector are both reduced.

2. The clock recovery unit of claim 1, wherein the data signal is a data signal of an NRZ format.

3. A clock recovery unit for recovering a clock synchronized with a given data signal, the clock recovery unit comprising:
   a voltage controlled oscillator for generating a clock having a frequency according to a control voltage;
   a first charge pump and a second charge pump whose respective outputs are coupled to a common node;
   a first phase detector for detecting a phase error in the clock with respect to one of a rising edge and a falling edge of the data signal so as to control the first charge pump according to the phase error; and
   a second phase detector for detecting a phase error in the clock with respect to the other one of the rising edge and the falling edge of the data signal so as to control the second charge pump according to the phase error detected by the second phase detector,
   wherein a voltage that is generated at the common node by the first and second charge pumps is given to the voltage controlled oscillator as the control voltage so that the phase error detected by the first phase detector and the phase error detected by the second phase detector are both reduced,
   said clock recovery unit further comprising:
   a first delay circuit inserted in a data input path of the second phase detector;
   a second delay circuit inserted in a clock input path of the second phase detector; and
   a third phase detector for detecting a phase error in an output of the second delay circuit with respect to an output of the first delay circuit and adjusting a delay amount of the first or second delay circuit so as to reduce the phase error detected by the third phase detector.

4. The clock recovery unit of claim 3, wherein:
   there is provided a period in which the first delay circuit receives, instead of the data signal, an adjustment signal based on serial data having a regular bit pattern; and
   when the third phase detector detects a lag phase error in an output of the second delay circuit with respect to an output of the first delay circuit in response to the adjustment signal, the third phase detector increases a delay amount of the first delay circuit so as to reduce the lag phase error, and has the increased delay amount stored, whereas when the third phase detector detects a lead phase error in the output of the second delay circuit with respect to the output of the first delay circuit in response to the adjustment signal, the third phase detector increases a delay amount of the second delay circuit so as to reduce the lead phase error, and has the increased delayed amount stored.

5. The clock recovery unit of claim 3, further comprising:
   a third delay circuit for outputting the data signal while delaying the data signal by one half of the delay amount of the first delay circuit; and
   a fourth delay circuit for outputting the clock while delaying the clock by one half of the delay amount of the second delay circuit.

* * * * *

UNITED STATES PATENT AND TRADEMARK OFFICE
CERTIFICATE OF CORRECTION

| | | |
|---|---|---|
| PATENT NO. | : 7,136,441 B2 | Page 1 of 1 |
| APPLICATION NO. | : 10/038613 | |
| DATED | : November 14, 2006 | |
| INVENTOR(S) | : Toru Iwata et al. | |

It is certified that error appears in the above-identified patent and that said Letters Patent is hereby corrected as shown below:

On the title page,

Item (56) References Cited, "FOREIGN PATENT DOCUMENTS", change
" JP  5-126357  10/1981 " to -- JP  56-126357  10/1981 --

Signed and Sealed this

Twenty-ninth Day of May, 2007

JON W. DUDAS
*Director of the United States Patent and Trademark Office*